US011146266B2

(12) United States Patent
Yee et al.

(10) Patent No.: US 11,146,266 B2
(45) Date of Patent: Oct. 12, 2021

(54) DRIVING METHOD AND DRIVING DEVICE USING THE SAME

(71) Applicant: SYNC POWER CORP., Taipei (TW)

(72) Inventors: Hsian-Pei Yee, Taipei (TW); Chun-Jen Huang, Taipei (TW)

(73) Assignee: SYNC POWER CORP., Taipei (TW)

( * ) Notice: Subject to any disclaimer, the term of this patent is extended or adjusted under 35 U.S.C. 154(b) by 0 days.

(21) Appl. No.: 16/686,683

(22) Filed: Nov. 18, 2019

(65) Prior Publication Data

US 2021/0152173 A1 May 20, 2021

(51) Int. Cl.
*H03K 17/687* (2006.01)
*H01F 27/28* (2006.01)
*H01F 27/24* (2006.01)
*H01F 19/08* (2006.01)

(52) U.S. Cl.
CPC ........... *H03K 17/687* (2013.01); *H01F 19/08* (2013.01); *H01F 27/24* (2013.01); *H01F 27/28* (2013.01)

(58) Field of Classification Search
CPC ... H03K 17/691; H01F 27/28; H01F 27/2804; H01F 27/2823; H01F 27/2828; H01F 27/24; H01F 27/245–266; H01F 19/08
See application file for complete search history.

(56) References Cited

U.S. PATENT DOCUMENTS

| | | | | | |
|---|---|---|---|---|---|
| 4,511,815 | A | * | 4/1985 | Wood | H03K 17/691 323/351 |
| 5,304,863 | A | * | 4/1994 | Cargille | H03K 17/691 327/108 |
| 2008/0315936 | A1 | * | 12/2008 | Mauthe | H03K 3/356104 327/333 |
| 2015/0130545 | A1 | * | 5/2015 | Chen | H03L 7/24 331/55 |
| 2020/0235672 | A1 | * | 7/2020 | Bieber | H03K 17/133 |

* cited by examiner

*Primary Examiner* — Patrick C Chen
(74) *Attorney, Agent, or Firm* — Muncy, Geissler, Olds & Lowe, P.C.

(57) ABSTRACT

A driving method and a driving device using the same are disclosed. The driving method controls a pulse transformer. The secondary winding of the pulse transformer is electrically connected to a control device. Firstly, positive charging electrical energy is delivered to the primary winding, thereby charging the control device. Then, the control device is disconnected from the secondary winding while the primary winding is in a high-impedance state. Finally, negative discharging electrical energy is delivered to the primary winding and the control device is electrically connected to the secondary winding, thereby discharging the control device, and the primary winding is in a low-impedance state after the step of delivering the negative discharging electrical energy to the primary winding.

13 Claims, 6 Drawing Sheets

DRIVING METHOD AND DRIVING DEVICE USING THE SAME

BACKGROUND OF THE INVENTION

Field of the Invention

The present invention relates to driving technology, particularly to a driving method and a driving device using the same.

Description of the Related Art

Various applications in the electronics industry require isolation of an electrical signal. One such application, for example, is that of off-line power supplies. In such power supplies, it is necessary to convey information about the status of the output voltage to a power controller. This information is commonly known as an error voltage signal or simply an error signal. More generally, this signal may be characterized as an analog signal. In many power supplies, it is required that the output voltage be electrically isolated from the source of power. If this requirement exists and, if, as is often the case, the power controller is electrically connected to the source of power, then it is necessary that the error signal be conveyed across an electrical isolation boundary. In such a process, the signal to be conveyed across the isolation boundary is known as the source signal, and the reconstructed conveyed signal is known as the target signal.

Two popular methods for conveying an analog signal across an electrical isolation boundary are known in the prior art. One such method is by optical conveyance using an optical isolator, also called an opto-coupler. Another such method is by magnetic conveyance using a transformer, which serves in the more specific capacity in such an application as a pulse transformer. Prior art power supplies which use primary-side controllers typically employ one of these two methods to isolate the error signal. As shown in FIG. 1 and FIG. 2, a pulse transformer 10 receives a square wave signal S to generate a power signal applied across a load 12. The square wave signal S has a fixed frequency, a maximum voltage of 10 volt, and a minimum voltage of 0 volt. As a result, the average voltage of the square wave signal S is 5 volt. Since the magnetic core of the pulse transformer 10 has a volt-time constant, the time of applying the average voltage of the square wave signal S to the pulse transformer 10 is limited. If the time of applying the average voltage of the square wave signal S to the pulse transformer 10 is too long, the magnetic core of the pulse transformer 10 will be saturated to short-circuit the primary winding of the pulse transformer 10. In order to avoid the saturation of the magnetic core, the size of the magnetic core is designed to be large. Alternatively, a capacitor is used to connect to the primary winding of the pulse transformer 10 in series, such that the average voltage of the square wave signal S is not transmitted to the secondary winding of the pulse transformer 10 but applied across the capacitor. However, the large magnetic core conflicts with miniaturization. Besides, the capacitor increases the response time of the pulse transformer 10 when the load 12 changes from a light-load state to a heavy-load state or changes from a heavy-load state to a light-load state. To overcome the abovementioned problems, the present invention provides a driving method and a driving device using the same, so as to solve the afore-mentioned problems of the prior art.

SUMMARY OF THE INVENTION

The primary objective of the present invention is to provide a driving method and a driving device using the same, by using a small magnetic core pulse transformer configured in connection to a multi-state driver to avoid the shortcomings of a traditional pulse transformer where no DC bias can be present at the windings, and a serial capacitor is thus required to filter out the DC bias in the driver, but at the cost of erroneous operations during rapid driver signal duty change (rapid load change).

Another objective of the present invention is to provide a driving method and a driving device using the same, which use the multi-state driver to allow the pulse transformer core into light saturation without resulting in large drive current, and utilize a high impedance state to take advantage of the residual magnetic core flux for better pulse transformer coupling when the driver signal is reversed, thus a smaller transformer core size can be used.

The third objective of the present invention is to provide a driving method and a driving device using the same, which has the ability to keep pulse transformer secondary side in the low impedance state when the primary side is in the low impedance state.

To achieve the abovementioned objectives, the present invention provides a driving method for controlling a pulse transformer, a secondary winding of the pulse transformer is electrically connected to a control device, and the driving method comprising: delivering positive charging electrical energy to the primary winding, thereby charging the control device; disconnecting the control device from the secondary winding after the step of charging the control device; and then delivering negative discharging electrical energy to the primary winding and electrically connecting the control device to the secondary winding, thereby discharging the control device, and the primary winding is in a low-impedance state after the step of delivering the negative discharging electrical energy to the primary winding. If even smaller pulse transformer core is desired, after the charging state, the driver is placed into a high impedance state, in which the near saturated flux of magnetic core retain most of its flux as residual, thus offering the discharging driver with an optimal range of operation, so that discharging can be completed more effectively and with less parasitical effects.

In an embodiment of the present invention, the control device is electrically connected to or disconnected from the secondary winding using a switching device.

In an embodiment of the present invention, the switching device further comprises a first electrical switch, a second electrical switch, and a resistor, the secondary winding is electrically connected to the first electrical switch and the second electrical switch, the control device is electrically connected to the first electrical switch and the second electrical switch, the first electrical switch is electrically connected to the second electrical switch, the resistor is electrically connected to the second electrical switch in series, and the control device is electrically connected to or disconnected from the secondary winding using the first electrical switch.

The present invention also provides a driving device comprising: a multi-state driver configured to sequentially generate multi-state configurations, which include at least one low impedance configuration and an optional high impedance state; a pulse transformer having a primary winding and a secondary winding, the primary winding is electrically connected to the multi-state driver, and the pulse transformer correspondingly configures itself according to the driver states; a switching device electrically connected to the secondary winding; and a control device electrically connected to the switching device. Upon driver charging signal, the switching device electrically connect the secondary winding to the control device and charge the control device through the switching device. Once charged, the switch device electrically disconnects the control device from the secondary winding. Upon discharging driver signal, the switching device electrically connects to the control device and discharge the control device through the switching device, and the switching device remain electrically connected to the discharged control device in order to transfer driver's low impendence state to the control device until the driver's next charging signal.

Below, the embodiments are described in detail in cooperation with the drawings to make easily understood the technical contents, characteristics and accomplishments of the present invention.

DETAILED DESCRIPTION OF THE INVENTION

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the figures are not drawn to scale; rather, these figures are merely intended for illustration.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Figure 1:
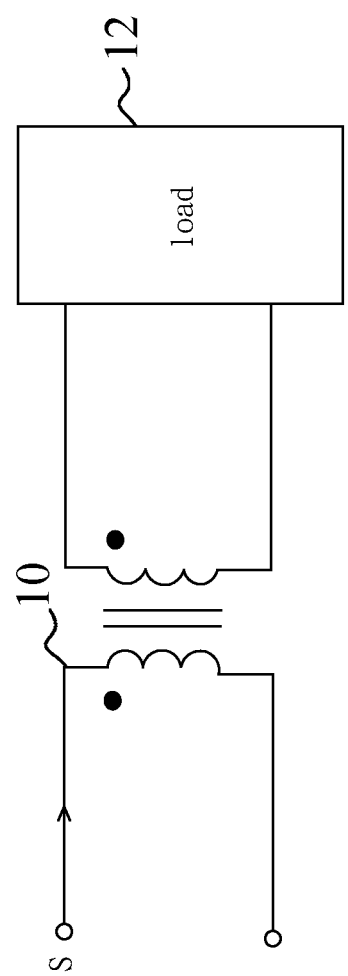
FIG. 1 is a schematic diagram illustrating a pulse transformer and a load in the conventional technology.
Figure 2:
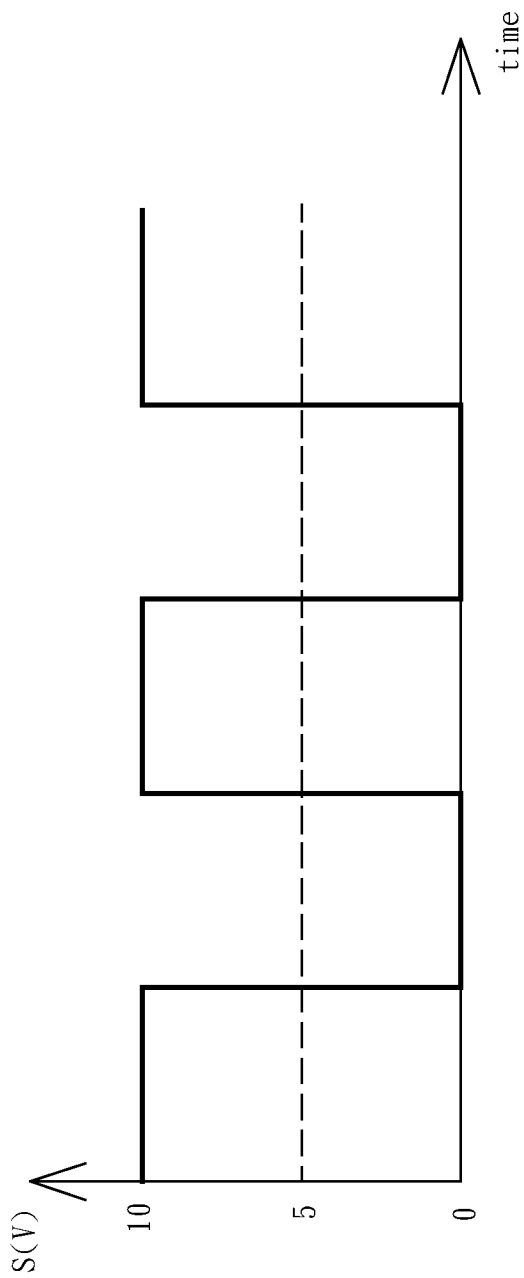
FIG. 2 is a diagram illustrating a square wave signal in the conventional technology.
Figure 3:
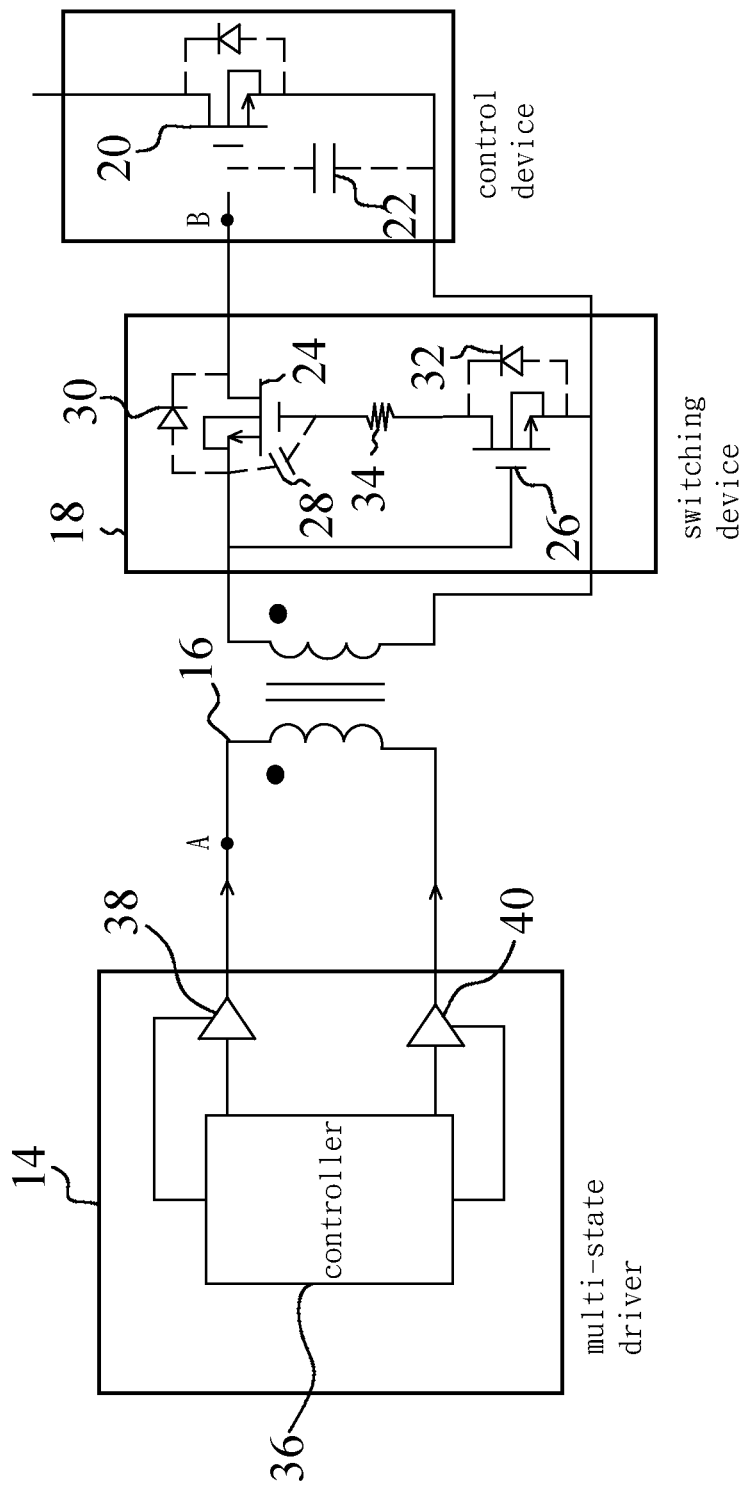
FIG. 3 is a schematic diagram illustrating a driving device according to an embodiment of the present invention.
Figure 4:
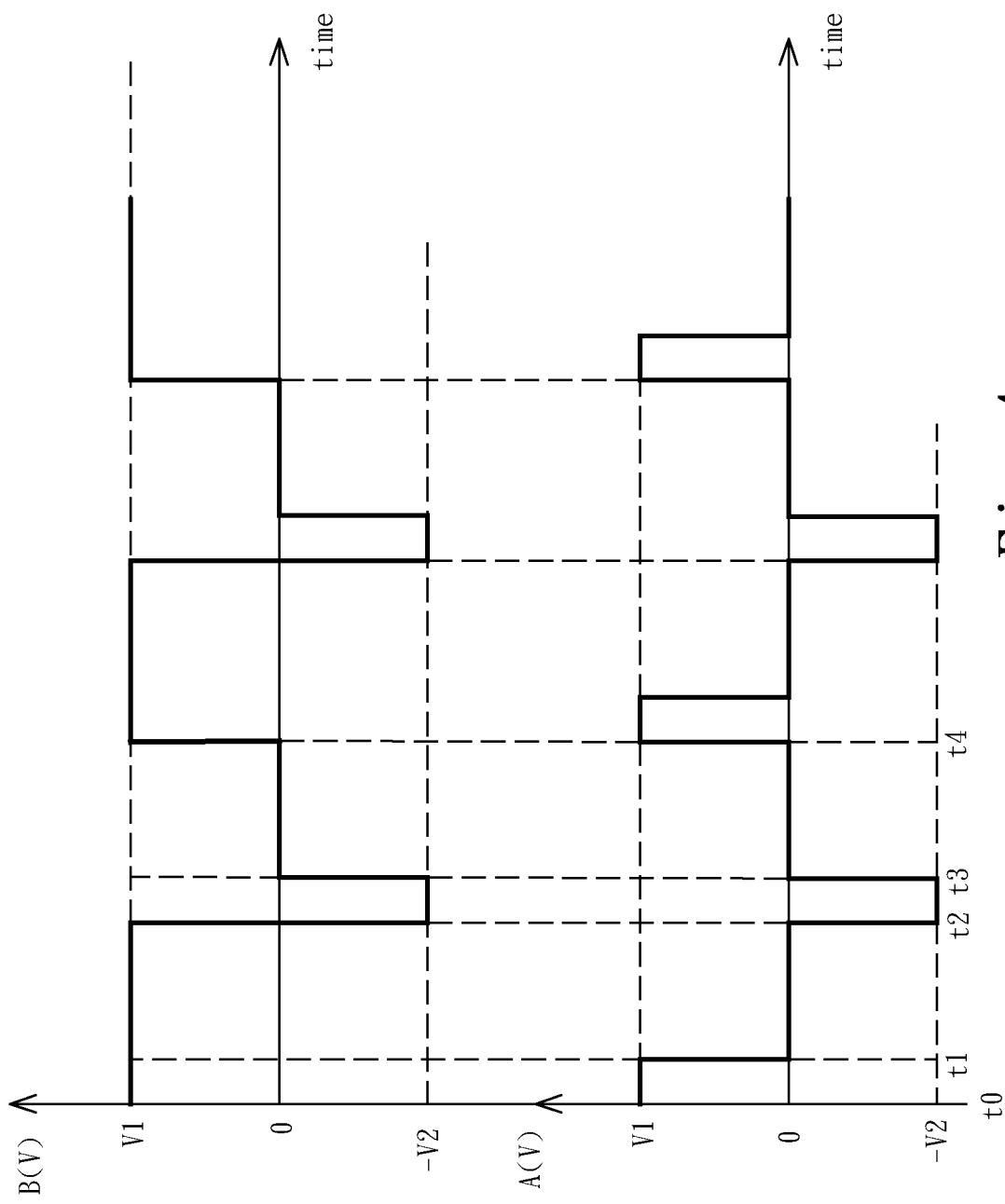
FIG. 4 is a schematic diagram illustrating waveforms nodes A and B according to an embodiment of the present invention.
Figure 5:
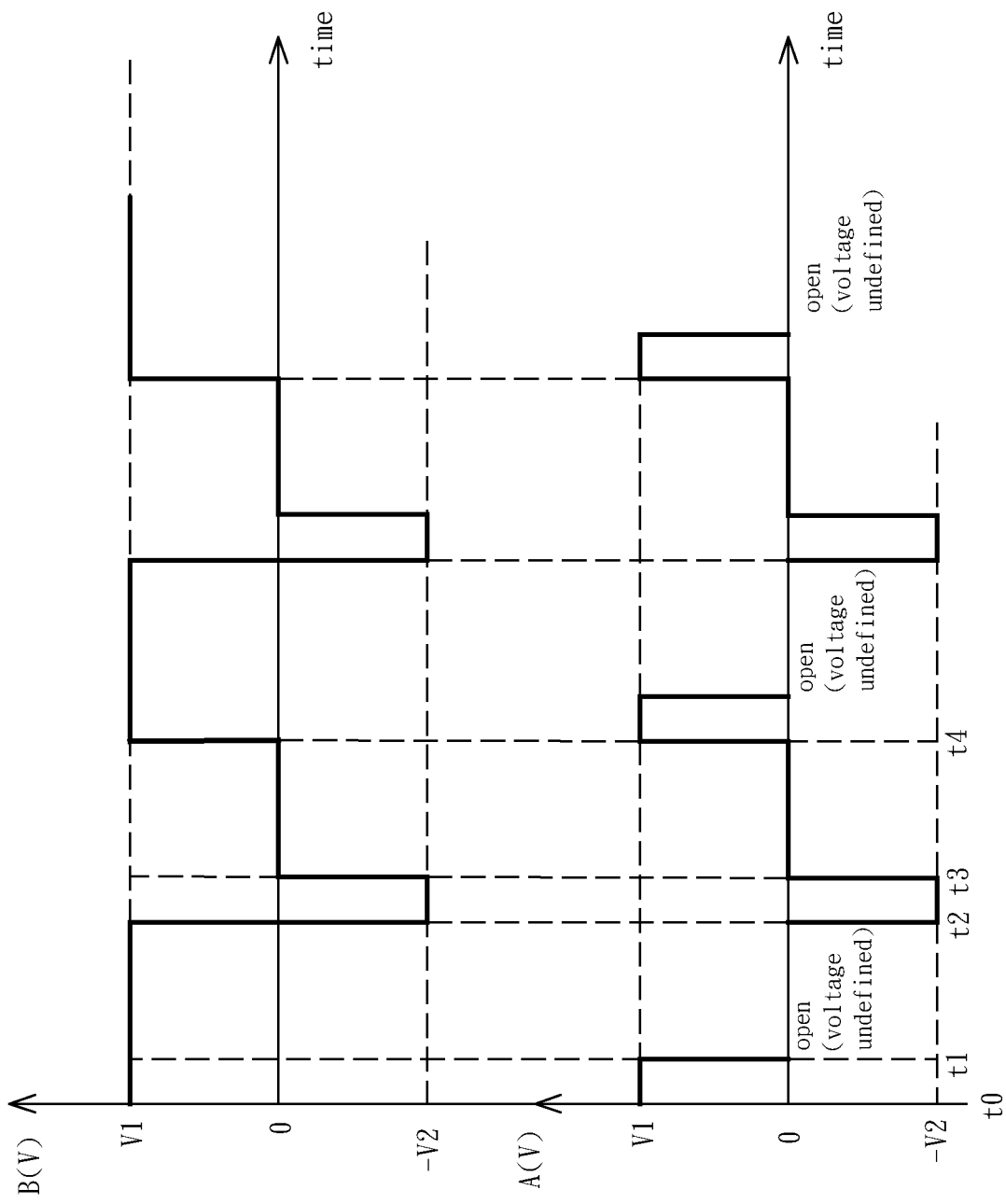
FIG. 5 is a schematic diagram illustrating waveforms nodes A and B according to another embodiment of the present invention.

Refer to FIG. 3, FIG. 4 and FIG. 5. The present invention provides a driving device comprises a multi-state driver 14, a pulse transformer 16, a switching device 18, and a control device 20. The multi-state driver 14 is configured to sequentially generate multi-state configurations, which include at least one low-impedance configuration, a positive charging configuration, and a negative discharging configuration. For example, the multi-state driver 14 generates a grounding voltage GND when the multi-state driver 14 generates the low-impedance configuration. The grounding voltage GND is 0 volt. For the optional high impedance configuration, the multi-state driver 14 electrically opens its connection to the pulse transformer. The pulse transformer 16 has a primary winding and a secondary winding, the primary winding has two inputs, the secondary winding has two outputs, the outputs further comprise a first output and a second output, and the inputs are electrically connected to the multi-state driver 14. The pulse transformer 16 correspondingly configures itself according to the driver states. The multi-state driver 14 uses the grounding voltage GND to short-circuit the primary winding and reduce the volt-time constant of the magnetic core; when the pulse transformer 16 configures the at least one low-impedance state. Optionally, in the charged state, the driver is placed into high impedance, in which the already near saturated flux of magnetic core retained most of its flux as residual, thus offering the next driver state (discharging state) with a more optimal range of operation, so that discharging can be completed more effectively and with less parasitical effects. The switching device 18 is electrically connected to the outputs of the pulse transformer 16 and the control device 20. The control device 20 has a first parasitic capacitance 22 between the switching device 18 and one of the outputs of the pulse transformer 16. For example, the control device 20 may be a power NMOSFET, but the present invention is not limited thereto. The power NMOSFET has a parasitic gate-to-source capacitance used as the first parasitic capacitance 22 and the gate and the source of the power NMOSFET are respectively electrically connected to the switching device 18 and the second output of the pulse transformer 16. The pulse transformer 16 uses the multi-state configurations to sequentially drive the switching device 18 to electrically connect the secondary winding to the control device 20 and charge the control device 20 through the switching device 18, drive the switching device 18 to disconnect the secondary winding from the control device 20, drive the switching device 18 to electrically connect the secondary winding to the control device 20 and discharge the control device 20 through the switching device 18, and drive the switching device 18 to maintain a voltage provided to the control device 20. The control device 20 is electrically connected to or disconnected from the secondary winding using the switching device 18.

Specifically, the multi-state driver 14 respectively transmits positive charging electrical energy and negative discharging electrical energy to the pulse transformer 16 to respectively charge and discharge the control device 20 through the switching device 18 when the multi-state driver 14 respectively generates the positive charging configuration and the negative discharging configuration. For example, the positive charging electrical energy and the negative discharging electrical energy may respectively a positive pulse voltage and a negative pulse voltage, and the absolute value of the positive pulse voltage is equal to or higher than the absolute value of the negative pulse voltage.

In an embodiment of the present invention, the switching device 18 further comprises a first electrical switch 24 and a second electrical switch 26, but the present invention is not limited thereto. The first electrical switch 24 has a control terminal, a first connecting terminal, a second connecting terminal, a parasitic capacitance 28, and a parasitic diode 30. The control terminal of the first electrical switch 24 is alternatively called a first control terminal. The parasitic capacitance 28 and the parasitic diode 30 are alternatively respectively called a second parasitic capacitance and a first parasitic diode. The first connecting terminal is electrically connected to the first output, the second connecting terminal and the second output are electrically connected to the control device 20, the first parasitic capacitance 22 is electrically connected between the second output and the second connecting terminal, the parasitic capacitance 28 is electrically connected between the first connecting terminal and the first control terminal, and the first anode and the first cathode of the parasitic diode 30 are respectively electrically connected to the first connecting terminal and the second connecting terminal. The parasitic diode 30 is electrically connected between the control device 20 and the secondary winding of the pulse transformer 16. The control device 20 is electrically connected to or disconnected from the secondary winding using the first electrical switch 24. The parasitic diode 30 of the first electrical switch 24 is OFF in the step of disconnecting the control device 20 from the secondary winding. The second electrical switch 26 has a second control terminal, a third connecting terminal, a fourth connecting terminal, and a second parasitic diode 32. The second control terminal is electrically connected to the first output, the third connecting terminal is electrically connected to the first control terminal, the fourth connecting terminal is electrically connected to the second output and the first parasitic capacitance 22 of the control device 20, the second anode and the second cathode of the second parasitic diode 32 are respectively electrically connected to the fourth connecting terminal and the third connecting terminal. The first electrical switch 24 is turned on using the second electrical switch 26 in the step of delivering the negative discharging electrical energy to the primary winding. The first electrical switch 24 is turned off using the second electrical switch 26 in the step of disconnecting the control device 20 from the secondary winding.

For example, the first electrical switch 24 may be a first N-channel metal oxide semiconductor field effect transistor (NMOSFET), but the present invention is not limited thereto. The source, the gate, and the drain of the first NMOSFET are respectively used as the first connecting terminal, the first control terminal, the second connecting terminal, the body and the source of the first NMOSFET are electrically connected to each other, the parasitic diode 30 is the parasitic body-to-drain diode of the first NMOSFET, and the parasitic capacitance 28 is the parasitic source-to-gate capacitor of the first NMOSFET. The parasitic capacitance 28 can be replaced with a capacitor electrically connected to the control terminal of the first electrical switch 24, to hold first electrical switch 24 ON when discharging the control device 20. The second electrical switch 26 may be a second N-channel metal oxide semiconductor field effect transistor (NMOSFET), but the present invention is not limited thereto. The source, the gate, and the drain of the second NMOSFET are respectively used as the fourth connecting terminal, the second control terminal, the third connecting terminal, the body and the source of the second NMOSFET are electrically connected to each other, and the second parasitic diode 32 is the parasitic body-to-drain diode of the second NMOSFET.

Alternatively or in combination, the switching device 18 further comprises a resistor 34 electrically connected to the second electrical switch 26 in series. For example, the resistor 34 is electrically connected between the first control terminal of the first electrical switch 24 and the third connecting terminal of the second electrical switch 26. The pulse transformer 16 correspondingly configures itself according to the driver states to drive the control device 20 using the first electrical switch 24, the second electrical switch 26, and the resistor 34.

In such a case, the multi-state configurations comprise the positive charging configuration, the negative discharging configuration, and the at least one low-impedance configuration. The at least one low-impedance configuration further comprises a first low-impedance configuration and a second low-impedance configuration. The multi-state driver 14 sequentially generates and transmits the positive pulse voltage V1, the grounding voltage GND, the negative pulse voltage −V2, and the grounding voltage GND to the primary winding of the pulse transformer 16 when the multi-state driver 14 sequentially generates the positive charging configuration, the first low-impedance configuration, the negative discharging configuration, and the second low-impedance configuration. Since the time durations of the positive pulse voltage and the negative pulse voltage are very short, the pulse transformer 16 has a small magnetic core to meet the trend of miniaturization and avoid wasting energy. In addition, since the magnetic core of the pulse transformer 16 is allowed into light saturation state, thus the driver does not need a capacitor to rebalance the drive signal, the present invention can reduce the response time of the pulse transformer when the control device 20 changes from a light-load state to a heavy-load state or changes from a heavy-load state to a light-load state without using any external capacitor connected to the primary winding of the pulse transformer 16 in series. In order to reduce the switching loss of the pulse transformer 16, the absolute value of the positive pulse voltage V1 is equal to or higher than the absolute value of the negative pulse voltage −V2.

The operation of the driving device is described as follows. Firstly, the multi-state driver 14 sequentially generates the positive pulse voltage V1, the grounding voltage GND, the negative pulse voltage −V2, and the grounding voltage GND. Then, the pulse transformer 16 sequentially receives the positive pulse voltage V1, the grounding voltage GND, the negative pulse voltage −V2, and the grounding voltage GND to drive the control device 20 using the switching device 18. Nodes A and B are respectively located at the upper input of the pulse transformer 16 and the second connecting terminal of the first electrical switch 24.

During t0-t1, the multi-state driver 14 delivers the positive charging electrical energy, such as the positive pulse voltage V1, to the primary winding. Then, the pulse transformer 16 receives the positive pulse voltage V1 to turn off the first electrical switch 24 and turn on the second electrical switch 26, such that the pulse transformer 16 provides a high-level voltage V1 for the control device 20 and the first parasitic capacitance 22 through the first parasitic diode 30, thereby charging the control device 20 and the first parasitic capacitance 22. Thus, the power NMOSFET used as the control device 20 is turned on. Besides, during t0-t1, the positive pulse voltage V1 charges the parasitic capacitor 28 to increase the voltage of the first control terminal until the voltage of the first control terminal reaches V1.

During t1-t2, the pulse transformer 16 receives the grounding voltage GND generated by the multi-state driver 14 to turn off the first electrical switch 24, the first parasitic diode 30, and the second electrical switch 26 and disconnect the control device 20 from the secondary winding after the step of charging the control device 20, such that the high-level voltage V1 is held constant and applied across the control device 20 and the first parasitic capacitance 22 when the multi-state driver 14 generates the grounding voltage GND. Thus, the power NMOSFET used as the control device 20 is turned on.

During t2-t3, the multi-state driver 14 delivers the negative discharging electrical energy, such as the negative pulse voltage −V2, to the primary winding. Then, the pulse transformer 16 receives the negative pulse voltage −V2 to drop the voltages of the first connecting terminal and the first control terminal to −V2, thereby turning on the second parasitic diode 32, turning off the second electrical switch 26, and generating a current to charge the parasitic capacitance 28 through the second parasitic diode 32 and the resistor 34. Thus, the voltage of the first control terminal is increased to turn on the first electrical switch 24 to electrically connect the control device 20 to the secondary winding, thereby discharging the control device 20. As a result, the pulse transformer 16 provides a low-level voltage −V2 for the control device 20 and the first parasitic capacitance 22 through the first electrical switch 24, thereby turning off the power NMOSFET used as the control device 20.

During t3-t4, the pulse transformer 16 receives the grounding voltage GND generated by the multi-state driver 14 to increase the voltages of the first connecting terminal and the first control terminal, turn off the second electrical switch 26, and maintain the original state of the first electrical switch 24 after the step of delivering the negative discharging electrical energy to the primary winding. Thus, the primary winding is in a low-impedance state. In other words, the first electrical switch 24 is still turned on. Thus, the pulse transformer 16 provides the ground voltage GND for the control device 20 and the first parasitic capacitance 22 through the first electrical switch 24. The grounding voltage GND is larger than the low-level voltage −V2 and less than the high-level voltage V1. During t3-t4, if a high voltage appears at the drain of the power NMOSFET used as the control device 20, the noise caused by the high voltage does not influence the gate voltage of the power NMOSFET through the parasitic gate-to-drain capacitor of the power NMOSFET. This is because the gate voltage of the power NMOSFET is maintained GND.

In order to reduce the leakage current of the first electrical switch 24 and avoid reducing the gate voltage of the power NMOSFET, the first low-impedance voltage GND generated by the multi-state driver 14 is replaced by a high-impedance voltage. That is to say, the multi-state driver 14 is configured to sequentially generate the positive pulse voltage V1, the high-impedance voltage, the negative pulse voltage −V2, and the low-impedance voltage GND.

Refer to FIG. 3 and FIG. 5. Another operation of the driving device is described as follows. In such a case, the multi-state configurations further comprise a high-impedance configuration that replaces the first low-impedance configuration. The multi-state driver 14 sequentially generates and transmits the positive pulse voltage V1, the negative pulse voltage −V2, and the grounding voltage GND to the primary winding of the pulse transformer 16 when the multi-state driver 14 sequentially generates the positive charging configuration, the high-impedance configuration, the negative discharging configuration, and the low-impedance configuration. Firstly, the multi-state driver 14 sequentially generates the positive pulse voltage V1, the negative pulse voltage −V2, and the grounding voltage GND. Then, the pulse transformer 16 sequentially receives the positive pulse voltage V1, the negative pulse voltage −V2, and the grounding voltage GND to drive the control device 20 using the switching device 18. Nodes A and B are respectively located at the upper input of the pulse transformer 16 and the second connecting terminal of the first electrical switch 24.

During t0-t1, the multi-state driver 14 delivers the positive charging electrical energy, such as the positive pulse voltage V1, to the primary winding. Then, the pulse transformer 16 receives the positive pulse voltage V1 to turn off the first electrical switch 24 and turn on the second electrical switch 26, such that the pulse transformer 16 provides a high-level voltage V1 for the control device 20 and the first parasitic capacitance 22 through the first parasitic diode 30, thereby charging the control device 20 and the first parasitic capacitance 22. Thus, the power NMOSFET used as the control device 20 is turned on. Besides, during t0-t1, the positive pulse voltage V1 charges the parasitic capacitor 28 to increase the voltage of the first control terminal until the voltage of the first control terminal reaches V1.

During t1-t2, the pulse transformer 16 detects the high-impedance configuration to turn off the first electrical switch 24, the first parasitic diode 30, and the second electrical switch 26 and disconnect the control device 20 from the secondary winding after the step of charging the control device 20, such that the high-level voltage V1 is held constant and applied across the control device 20 and the first parasitic capacitance 22 when the multi-state driver 14 generates the high-impedance configuration. The high-impedance configuration represents that the primary winding is open-circuited and floating in a high-impedance state. Thus, the power NMOSFET used as the control device 20 is turned on.

During t2-t3, the multi-state driver 14 delivers the negative discharging electrical energy, such as the negative pulse voltage −V2, to the primary winding. Then, the pulse transformer 16 receives the negative pulse voltage −V2 to drop the voltages of the first connecting terminal and the first control terminal to −V2, thereby turning on the second parasitic diode 32, turning off the second electrical switch 26, and generating a current to charge the parasitic capacitance 28 through the second parasitic diode 32 and the resistor 34. Thus, the voltage of the first control terminal is increased to turn on the first electrical switch 24 to electrically connect the control device 20 to the secondary winding, thereby discharging the control device 20. As a result, the pulse transformer 16 provides a low-level voltage −V2 for the control device 20 and the first parasitic capacitance 22 through the first electrical switch 24, thereby turning off the power NMOSFET used as the control device 20.

During t3-t4, the pulse transformer 16 receives the grounding voltage GND generated by the multi-state driver 14 to increase the voltages of the first connecting terminal and the first control terminal, turn off the second electrical switch 26, and maintain the original state of the first electrical switch 24 after the step of delivering the negative discharging electrical energy to the primary winding. Thus, the primary winding is in a low-impedance state. In other words, the first electrical switch 24 is still turned on. Thus, the pulse transformer 16 provides the ground voltage GND for the control device 20 and the first parasitic capacitance 22 through the first electrical switch 24. The grounding voltage GND is larger than the low-level voltage −V2 and less than the high-level voltage V1. During t3-t4, if a high voltage appears at the drain of the power NMOSFET used as the control device 20, the noise caused by the high voltage does not influence the gate voltage of the power NMOSFET through the parasitic gate-to-drain capacitor of the power NMOSFET. This is because the gate voltage of the power NMOSFET is maintained GND.

In an embodiment of the present invention, the multi-state driver 14 further comprises a controller 36, a first tri-state buffer 38, and a second tri-state buffer 40, but the present invention is not limited thereto. The first tri-state buffer 38 and the second tri-state buffer 40 are electrically connected to the controller 36. The first tri-state buffer 36 and the second tri-state buffer 38 are respectively electrically connected to the inputs of the pulse transformer 16, and the controller 36 is configured to enable or disable the first tri-state buffer 38 and the second tri-state buffer 40 to generate the multi-state configurations.

Figure 6:
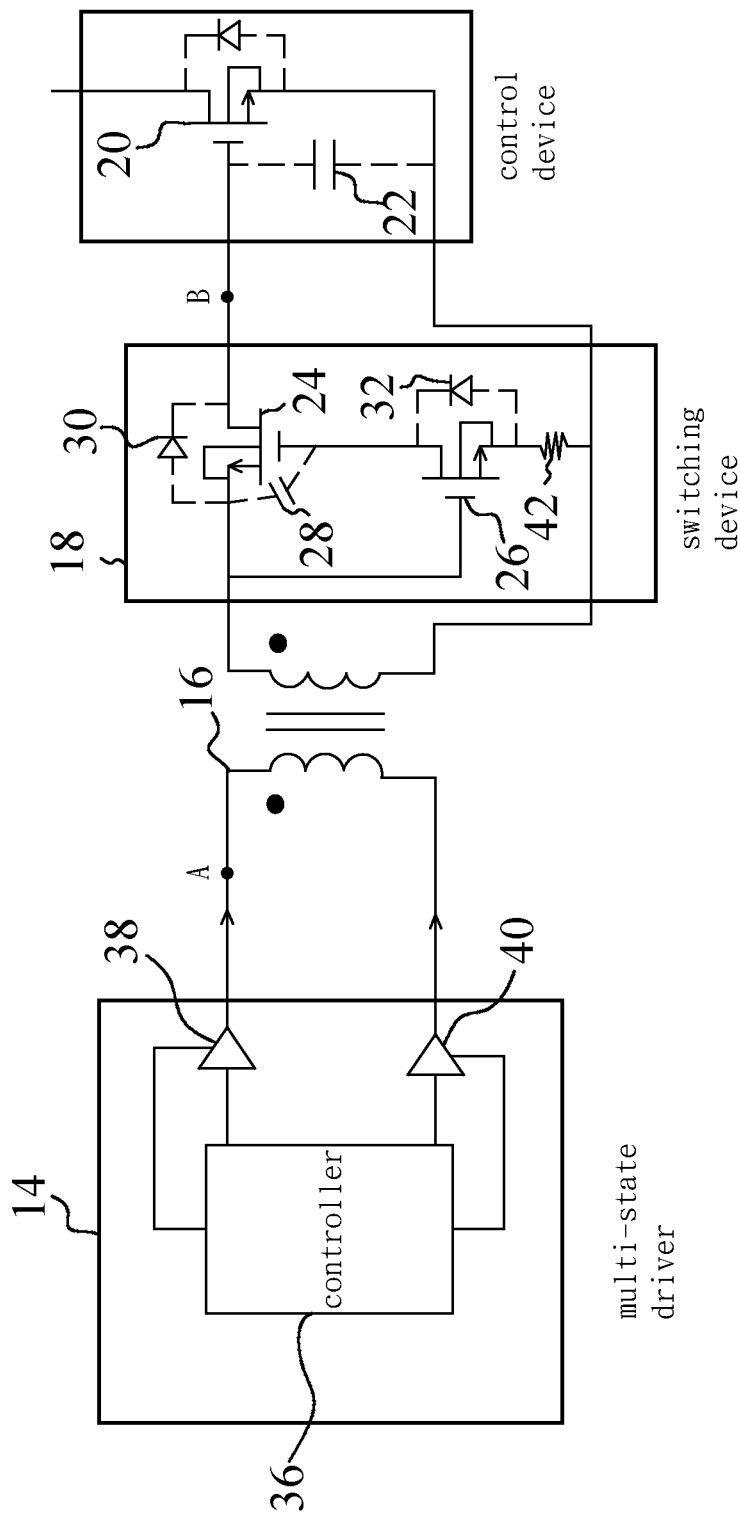
FIG. 6 is a schematic diagram illustrating a driving device according to another embodiment of the present invention.

FIG. 6 is a schematic diagram illustrating a driving device according to another embodiment of the present invention. FIG. 6 is different from FIG. 3 in the position of the resistor. As shown FIG. 3 and FIG. 6, the resistor 34 of FIG. 3 is replaced with a resistor 42 of FIG. 6. The resistor 42 is electrically connected between the second output of the secondary winding and the fourth connecting terminal of the second electrical switch 26. The operation of FIG. 6 is the same to that of FIG. 3 so will not be reiterated here.

In conclusion, the present invention uses the multi-state driver and the pulse transformer with a small magnetic core to reduce the volt-time constant of the magnetic core and meet the trend of miniaturization and reduces the response time of the pulse transformer when the control device changes from a light-load state to a heavy-load state or changes from a heavy-load state to a light-load state without using any external capacitor.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A driving method for controlling a pulse transformer, a secondary winding of the pulse transformer is electrically connected to a control device, and the driving method comprising:
    delivering positive charging electrical energy to the primary winding, thereby charging the control device;
    disconnecting the control device from the secondary winding after the step of charging the control device; and
    delivering negative discharging electrical energy to the primary winding and electrically connecting the control device to the secondary winding, thereby discharging the control device, and the primary winding receiving a grounding voltage and maintaining an electrical connection between the control device and the secondary winding to transfer the grounding voltage to the control device after the step of delivering the negative discharging electrical energy to the primary winding, wherein the control device is electrically connected to or disconnected from the secondary winding using a switching device, the switching device comprises:
    a first electrical switch electrically connected to the secondary winding and the control device;
    a second electrical switch electrically connected to the secondary winding, the control device, and the first electrical switch; and
    a capacitor electrically connected to a control terminal of the first electrical switch, to hold the first electrical switch ON in the step of discharging the control device.

2. The driving method of claim 1, wherein the control device is disconnected from the secondary winding when the primary winding is in a high-impedance state.

3. The driving method of claim 1, wherein the switching device further comprises a resistor, the resistor is electrically connected to the second electrical switch in series, and the control device is electrically connected to or disconnected from the secondary winding using the first electrical switch.

4. The driving method of claim 3, wherein the first electrical switch has a parasitic diode electrically connected between the control device and the secondary winding of the pulse transformer.

5. The driving method of claim 4, wherein the parasitic diode of the first electrical switch is OFF in the step of disconnecting the control device from the secondary winding.

6. The driving method of claim 3, wherein the first electrical switch is turned on using the second electrical switch in the step of delivering the negative discharging electrical energy to the primary winding.

7. The driving method of claim 3, wherein the first electrical switch is turned off using the second electrical switch in the step of disconnecting the control device from the secondary winding.

8. The driving method of claim 1, wherein the positive charging electrical energy and the negative discharging electrical energy are respectively a positive pulse voltage and a negative pulse voltage, and an absolute value of the positive pulse voltage is equal to or higher than an absolute value of the negative pulse voltage.

9. A driving device comprising:
    a multi-state driver configured to sequentially generate multi-state configurations, which include at least one low-impedance configuration, wherein when the multi-state driver generates the at least one low-impedance configuration, the multi-state driver generates a grounding voltage;
    a pulse transformer having a primary winding and a secondary winding, the primary winding is electrically connected to the multi-state driver, and the pulse transformer is configured to detect the multi-state configurations;
    a switching device electrically connected to the secondary winding; and
    a control device electrically connected to the switching device, when the pulse transformer detects the multi-state configurations, the pulse transformer uses the multi-state configurations to sequentially drive the switching device to electrically connect the secondary winding to the control device and charge the control device through the switching device, drive the switching device to disconnect the secondary winding from the control device, drive the switching device to electrically connect the secondary winding to the control device and discharge the control device through the switching device, and drive the switching device to maintain an electrical connection between the control device and the secondary winding to transfer the grounding voltage to the control device and maintain a voltage provided to the control device, wherein the switching device further comprises:
    a first electrical switch electrically connected to the secondary winding and the control device;
    a second electrical switch electrically connected to the secondary winding, the control device, and the first electrical switch; and
    a capacitor electrically connected to a control terminal of the first electrical switch, to hold first electrical switch ON when discharging the control device.

10. The driving device of claim 9, wherein the multi-state configurations further include at least one high impedance configuration.

11. The driving device of claim 9, wherein the multi-state configurations further include a positive charging configuration and a negative discharging configuration, the multi-state driver respectively transmits positive charging electrical energy and negative discharging electrical energy to the pulse transformer to respectively charge and discharge the control device through the switching device when the multi-state driver respectively generates the positive charging configuration and the negative discharging configuration.

12. The driving device of claim 11, wherein the positive charging electrical energy and the negative discharging electrical energy are respectively a positive pulse voltage and a negative pulse voltage, and an absolute value of the positive pulse voltage is equal to or higher than an absolute value of the negative pulse voltage.

13. The driving device of claim 9, wherein the switching device further comprises a resistor electrically connected to the second electrical switch in series.

* * * * *